(12) United States Patent
Ikezawa

(10) Patent No.: US 9,967,994 B2
(45) Date of Patent: May 8, 2018

(54) INSULATOR FOR MAGNETIC CORE AROUND A BUS BAR

(71) Applicant: TDK CORPORATION, Tokyo (JP)

(72) Inventor: Akira Ikezawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 548 days.

(21) Appl. No.: 14/600,468

(22) Filed: Jan. 20, 2015

(65) Prior Publication Data

US 2015/0208534 A1 Jul. 23, 2015

(30) Foreign Application Priority Data

Jan. 20, 2014 (JP) .................................. 2014-007886

(51) Int. Cl.
| | |
|---|---|
| H02G 5/06 | (2006.01) |
| H05K 7/14 | (2006.01) |
| H01F 27/28 | (2006.01) |
| H01F 27/30 | (2006.01) |
| H01F 37/00 | (2006.01) |

(52) U.S. Cl.
CPC ....... H05K 7/1432 (2013.01); H01F 27/2852 (2013.01); H01F 27/306 (2013.01); H01F 37/00 (2013.01)

(58) Field of Classification Search
CPC .... H01F 27/2852; H01F 27/306; H01F 37/00; H01F 7/1432; H01F 17/06; H01F 17/065; H01F 27/06
USPC ...................................................... 174/72 B
See application file for complete search history.

(56) References Cited

U.S. PATENT DOCUMENTS

| 5,119,059 A * | 6/1992 | Covi ....................... H01F 27/38 323/250 |
| 6,130,519 A * | 10/2000 | Whiting ................ H02J 7/0034 320/105 |
| 2004/0233015 A1* | 11/2004 | Tsai ....................... H03H 7/427 333/181 |
| 2005/0161809 A1* | 7/2005 | Nakatsu ................ H02M 7/003 257/734 |
| 2006/0082948 A1* | 4/2006 | Wu .......................... H01F 17/04 361/118 |
| 2006/0145804 A1* | 7/2006 | Matsutani ............. H01F 27/027 336/200 |

(Continued)

FOREIGN PATENT DOCUMENTS

| JP | H09-271113 A | 10/1997 |
| JP | H11-275716 A | 10/1999 |

(Continued)

Primary Examiner — Timothy Thompson
Assistant Examiner — Rhadames J Alonzo Miller
(74) Attorney, Agent, or Firm — Oliff PLC

(57) ABSTRACT

An insulating component having a first core accommodating section that receives a first magnetic body core, a second core accommodating section that receives a second magnetic body core, and a locking section. The first core accommodating section has two parallel core leg section accommodating sections that individually surround one of at least two leg sections of the first magnetic body core. The second core accommodating section is configured to surround the second magnetic body core. An aperture section is formed in the insulating component between the two parallel core leg section accommodating sections. The locking section is configured to be locked to a bus bar inserted into that aperture section.

11 Claims, 17 Drawing Sheets

(56) References Cited

U.S. PATENT DOCUMENTS

| | | | | |
|---|---|---|---|---|
| 2010/0117780 A1* | 5/2010 | Hsieh | ............... | H01F 27/2852 336/222 |
| 2010/0237971 A1* | 9/2010 | Ikezawa | ............... | H01F 27/22 336/61 |
| 2010/0265029 A1* | 10/2010 | Xiong | ............... | H01F 27/2852 336/232 |
| 2011/0050222 A1* | 3/2011 | Ueno | ............... | G01R 15/207 324/253 |
| 2011/0068771 A1* | 3/2011 | Ueno | ............... | G01R 15/202 324/117 R |
| 2013/0027173 A1* | 1/2013 | Ohsawa | ............... | H01F 27/2852 336/220 |
| 2013/0141878 A1* | 6/2013 | Wu | ............... | H01F 27/2852 361/748 |

FOREIGN PATENT DOCUMENTS

| | | | |
|---|---|---|---|
| JP | 2000-182844 | A | 6/2000 |
| JP | 2002-243768 | A | 8/2002 |
| JP | 2005-085919 | A | 3/2005 |
| JP | 2005-093451 | A | 4/2005 |
| JP | 2007-028785 | A | 2/2007 |
| JP | 2013-015195 | A | 1/2013 |

* cited by examiner

INSULATOR FOR MAGNETIC CORE AROUND A BUS BAR

BACKGROUND OF THE INVENTION

Field of the Invention

The present invention relates to an insulating component and a conductive component including the insulating component.

Related Background Art

In a power supply device of the related art, an electronic component in which magnetic body cores are disposed around a bus bar through which current flows is used as a current detecting device or a noise filter. In such an electronic component, an insulation property between the magnetic body core and the bus bar should be maintained. For this reason, as a method of disposing the magnetic body core and the bus bar while maintaining the insulation property therebetween, for example, as described in Japanese Patent Application Laid-Open No. 2007-28785 and Japanese Patent Application Laid-Open No. 2002-243768, a method of forming an aperture section between the magnetic body core and the bus bar is known.

SUMMARY OF THE INVENTION

However, in the method disclosed in the above-mentioned Patent Literature, probability of an insufficient insulation property is considered. For example, the magnetic body core and the bus bar may come in contact with each other due to vibrations or the like. In addition, as a metal powder or the like that may be generated upon assembly or the like of the components is attached, contact between the magnetic body core and the bus bar via the metal powder is also considered. In this regard, for example, as a bobbin formed of an insulating material is integrally formed with the bus bar, while a method of maintaining the insulation property between the bus bar and the magnetic body core by the bobbin formed of the insulating material is also considered, a process related to integral formation is needed, a work load is increased, and thus high cost thereof is a concern.

In consideration of the above-mentioned circumstances, the present invention is directed to provide an insulating component having good workability and with which a bus bar and another component can be disposed while maintaining a high insulation property therebetween, and a conductive component including the insulating component.

In order to accomplish the above-mentioned objects, an insulating component according to an aspect of the present invention is constituted by a member having an insulation property, and has: a first core accommodating section having two core leg section accommodating sections configured to individually accommodate at least two leg sections provided in a first magnetic body core, which is one magnetic body core of a pair of magnetic body cores, and disposed to be spaced apart from each other; a second core accommodating section configured to accommodate a second magnetic body core, which is the other magnetic body core different from the one magnetic body core; and a locking section configured to be locked to a bus bar inserted into an aperture section formed between the two core leg section accommodating sections.

According to the above-mentioned insulating component, since the first magnetic body core is accommodated in the first magnetic body core accommodating section, the second magnetic body core is accommodated in the second magnetic body core accommodating section, and further, the bus bar is inserted into the aperture section formed between the two core leg section accommodating sections of the first core accommodating section, a high insulation property between the bus bar and the pair of magnetic body cores is maintained by the insulating component. Further, since the insulating component can be locked to the bus bar by the locking section and the insulating component and the bus bar can be integrated through the locking, good workability can be obtained.

In addition, a conductive component according to the present invention is a conductive component including: the above-mentioned insulating component; and a conductive bus bar inserted into the aperture section, wherein a through-hole is formed in the bus bar, and the locking section of the insulating component is configured to include a claw section locked to the through-hole.

In the above-mentioned conductive component, as the insulating component includes the claw section configured to be locked to the through-hole of the bus bar, the bus bar and the insulating component can be easily integrated, and improvement of workability can be realized more simply.

Here, end sections of the two core leg section accommodating sections protrude more than an end section of the bus bar disposed between the two core leg section accommodating sections.

In this way, as the end sections of the two core leg section accommodating sections protrude more than the end section of the bus bar, for example, since the contact with the bus bar can be prevented even when the electronic components such as the pair of magnetic body cores or the like are placed at the end section sides of the two core leg section accommodating sections, a high insulation property can be obtained.

Further, the bus bar may have a screw hole serving as a through-hole configured to screw-fasten and fix a member different from the insulating component, and the insulating component may have a concave section configured to surround one end section of the screw hole.

In this way, as the insulating component has the concave section configured to surround the one end section of the screw hole, since the metal powder generated as the screw cuts the bus bar or the like upon the screw fastening can be suppressed from being scattered around, the metal powder can be prevented from sticking to the electronic component therearound and the bus bar and the other electronic component can be prevented from being short-circuited by the metal powder.

Further, a conductive component according to the present invention includes an insulating component constituted by a member having an insulation property; and a conductive bus bar having a screw hole serving as a through-hole configured to screw-fasten and fix a member different from the insulating component, wherein the insulating component has a concave section configured to surround one end section of the screw hole, and a locking section configured to be locked to the bus bar.

In this way, as the conductive component has the insulating component having the concave section configured to surround the one end section of the screw hole configured to screw-fasten and fix the bus bar, since the metal powder generated from the bus bar or the like upon the screw fastening and fixing can be suppressed from being scattered therearound, the bus bar and the other component can be assembled while maintaining the high insulation property therebetween. Further, since the insulating component can be locked to the bus bar by the locking section and the insulating component and the bus bar can be integrated through the locking, good workability can be obtained.

According to the present invention, an insulating component having good workability and with which a bus bar and another component can be disposed while maintaining a high insulation property therebetween, and a conductive component including the insulating component are provided.

DESCRIPTION OF THE PREFERRED EMBODIMENTS

Figure 1:
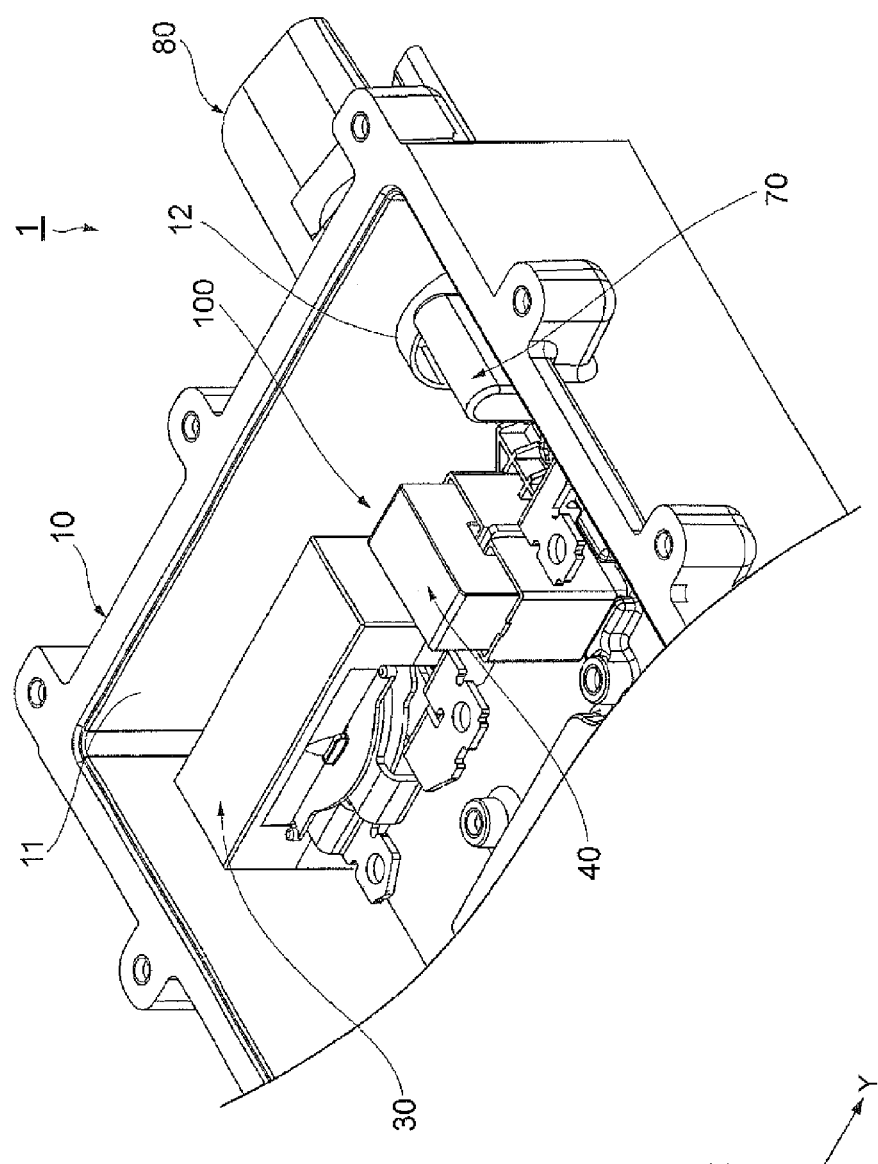
FIG. 1 is a partially cut perspective view of a power supply device including a conductive component according to an embodiment of the present invention.

Hereinafter, an embodiment of the present invention will be described in detail with reference to the accompanying drawings. Further, throughout the drawings, the same elements are designated by the same reference numerals, and overlapping description thereof will be omitted.

Figure 2:
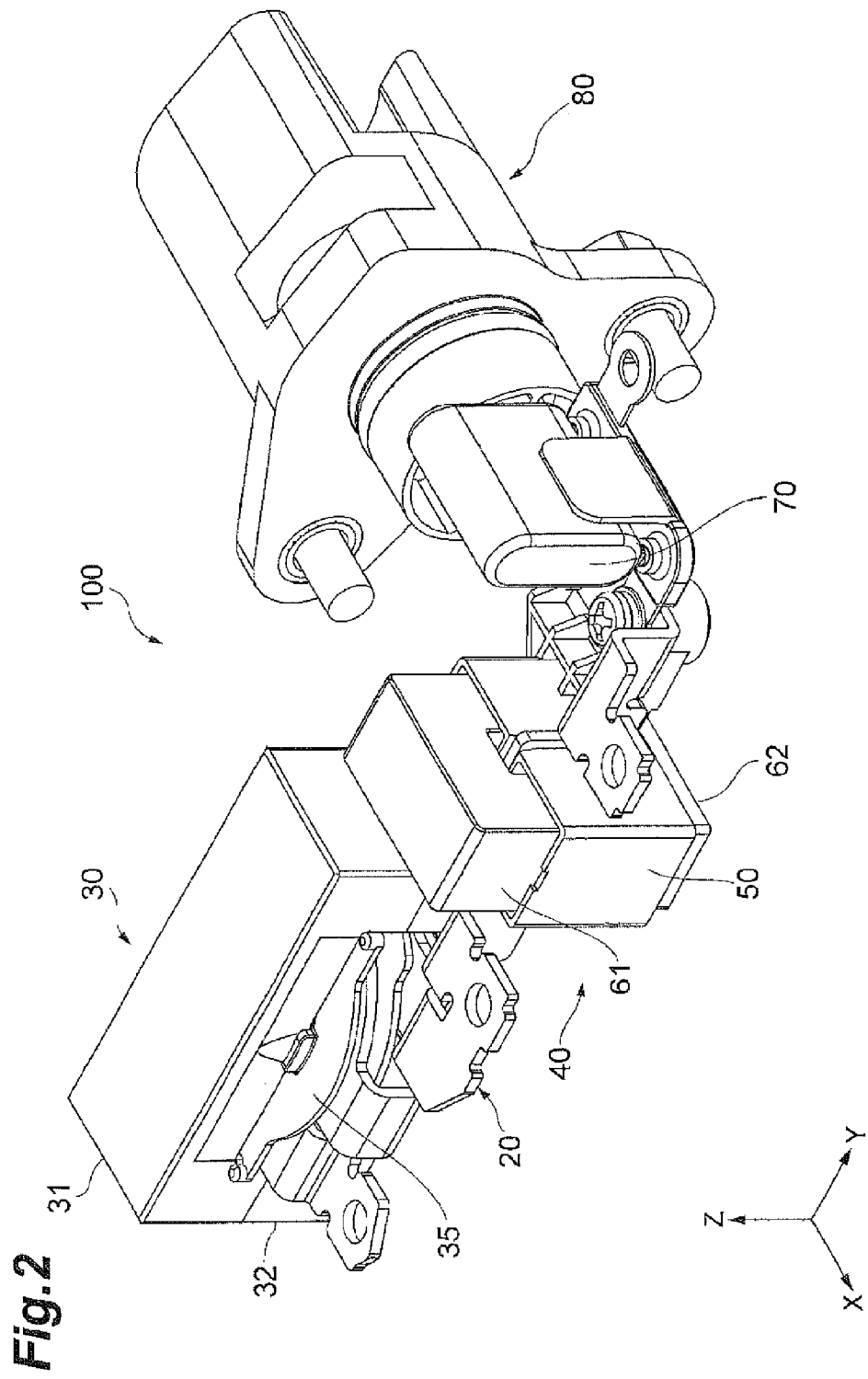
FIG. 2 is a perspective view showing a schematic configuration of an electronic component including the conductive component according to the embodiment of the present invention.
Figure 3:
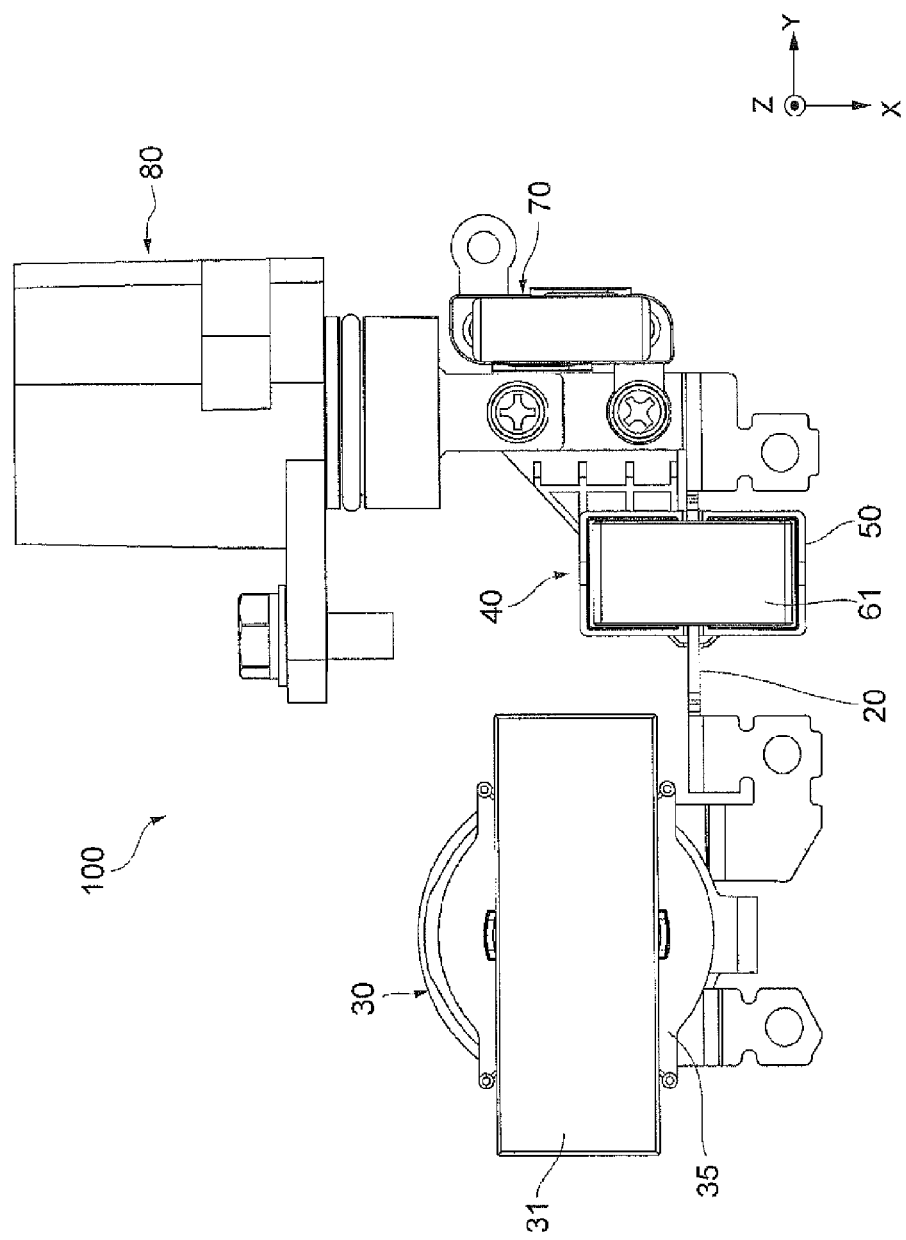
FIG. 3 is a top view of the electronic component.

First, a power supply device including a conductive component and an electronic component including a conductive component according to the embodiment will be described with reference to FIGS. 1 to 3. FIG. 1 is a partially cut perspective view of the power supply device. In addition, FIG. 2 is a perspective view showing a schematic configuration of the electronic component, and FIG. 3 is a top view of the electronic component. Further, in the following drawings, for the convenience of description, X, Y and Z axes are described according to necessity.

(Power Supply Device)

As shown in FIG. 1, a power supply device 1 includes a housing 10 and electronic components 100. In the power supply device 1, an input condenser, a switching element, a main transformer, a choke inductor, a control board, an output condenser, and so on are accommodated in the housing 10, and these components are connected by a conductive member having conductivity such as a bus bar or the like. Among them, a choke coil 30, a noise filter 40, an output condenser 70 and a penetration type terminal stand 80 are included among the electronic components 100. The penetration type terminal stand 80 is attached to pass through a through-hole 12 formed in a sidewall 11 of the housing 10 extending along a YZ plane, and functions as an output-side terminal configured to electrically connect the inside and the outside of the housing 10 of the power supply device 1.

While the housing 10 includes a main body section including a bottom surface and the sidewall 11, and a lid section configured to cover the main body section, in FIG. 1, only a portion of the main body section is shown. In addition, in FIG. 1, illustration other than a region in which the electronic component 100 is placed is omitted.

(Electronic Component)

Next, the configuration included in the electronic components 100 will be described. The electronic components 100 include elements having their functions as the components are attached to a bus bar 20 manufactured from a conductive plate through cutting.

Specifically, the penetration type terminal stand 80 is attached to one end section of the bus bar 20, and electrically connected to the outside by the penetration type terminal stand 80. In addition, an end section opposite to the penetration type terminal stand 80 side constitutes the choke coil 30 as the bus bar 20 is wound in a winding shape and a pair of magnetic body cores 31 and 32 and a bobbin 35 for coils are attached. In addition, the noise filter 40 is configured by attaching a pair of magnetic body cores 61 and 62 (a first magnetic body core and a second magnetic body core) that continue to the choke coil 30 via a bobbin 50 (an insulating component) to surround the bus bar 20. Further, the output condenser 70 is attached to the bus bar 20 between the noise filter 40 and the penetration type terminal stand 80.

In this way, the electronic component 100 is a component to which a plurality of functional units are connected by the bus bar 20, and a component of a so-called downstream side of the electronic components in the housing 10 constituting the power supply device 1, which is disposed closest to an output side.

In the following description, after the bus bar 20 and the bobbin 50 that constitute the electronic component is described, a method of assembling a connecting component serving as a component obtained by assembling these will be described. Then, a method of assembling the electronic component 100 by attaching the other components to the connecting component will be described.

(Bus Bar)

Figure 4:
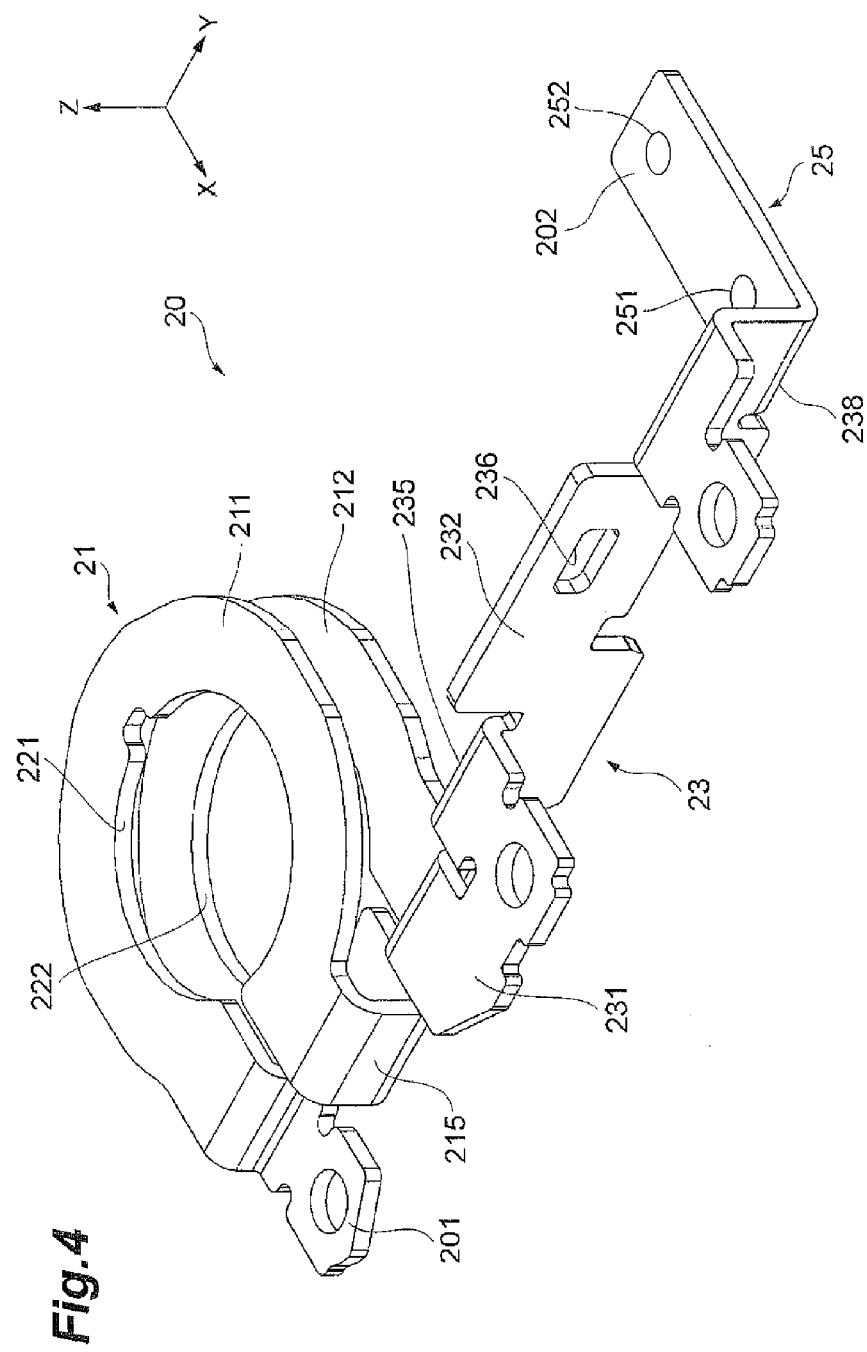
FIG. 4 is a perspective view of a bus bar.
Figure 5:
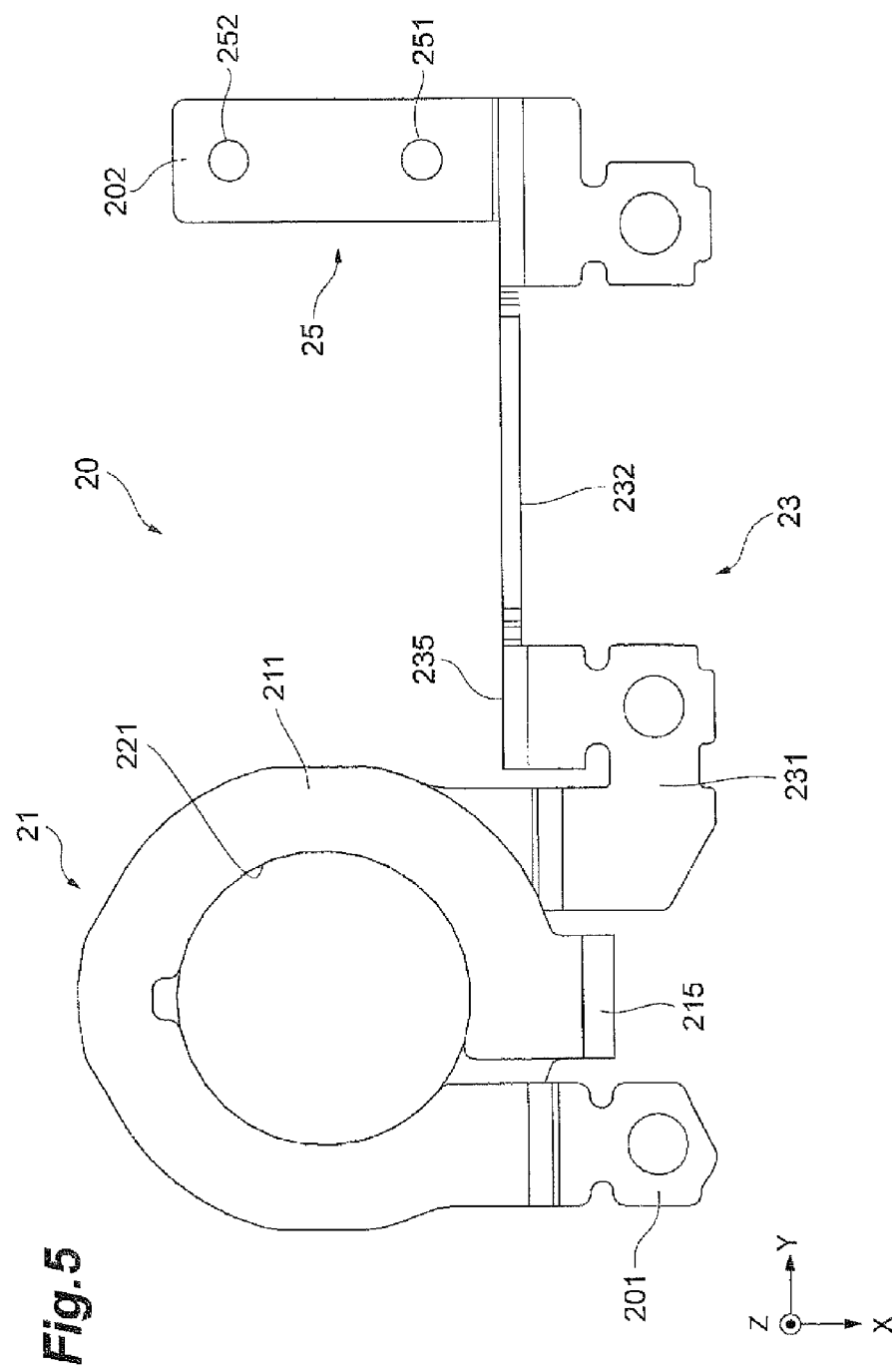
FIG. 5 is a top view of the bus bar.

The bus bar 20 will be described with reference to FIGS. 4 and 5. FIG. 4 is a perspective view of the bus bar 20, and FIG. 5 is a top view of the bus bar 20, The bus bar 20 is manufactured by punching a flat plate formed of a conductive material such as a copper plate or the like and then folding the parts.

In the bus bar 20, a coil section 21, a filter section 23, and a link section 25 are formed from an end section of one side (a −Y side) toward an end section of the other side (a +Y side) in this order.

The coil section 21 is constituted by the first coil section 211 and the second coil section 212 installed in parallel at intervals, having an edged ring shape and a plate shape, and connected to continue in a predetermined winding direction. The first coil section 211 and the second coil section 212 are linked by a communication section 215. The first coil section 211 and the second coil section 212 having the edged ring shape are shown in a so-called C shape, have circular openings 221 and 222 at centers thereof, and concentrically overlap each other on the same axis extending in a the Z-axis direction such that the openings 221 and 222 come in communication with each other. Further, the shape of the first coil section 211 and the second coil section 212 is not limited to the above-mentioned edged ring shape having the C shape but, for example, may have another shape such as an oval shape, a rectangular shape, or the like.

A first terminal section 201 protruding outward with respect to a central axis of the opening 221 is formed at one end section of the first coil section 211. The other end section of the second coil section 212 is connected to the filter section 23 (to be described below), In the coil section 21 of the bus bar 20, power input into the first terminal section 201 flows to the filter section 23 of a rear stage after flowing through the first coil section 211, the communication section 215 and the second coil section 212 in this order.

The filter section 23 is configured to include a first conductive section 231 extending along an XY plane in a Y-axis direction, and a second conductive section 232 linked to the first conductive section 231 and extending along the YZ plane in the Y-axis direction. A portion between the first conductive section 231 and the second conductive section 232 is bent by a folding line 235 extending along the Y-axis. A through-hole 236 is formed in the second conductive section 232. The through-hole 236 is used to lock the bobbin 50 that constitutes the noise filter 40. This will be described below.

The link section 25 to which an electrical element or the like is linked is formed at a rear stage of the second conductive section 232 of the filter section 23. The link section 25 is bent at the end section of the rear stage side of the second conductive section 232 by a folding line 238 extending along the Y-axis, and then extends along the XY plane in an X-axis direction (a −X direction). In the link section 25, a screw hole 251 serving as a through-hole configured to attach the output condenser 70 and a screw hole 252 serving as a through-hole configured to be connected to the penetration type terminal stand 80 are formed. A position at which the screw hole 252 is formed becomes an end section opposite to the end section at which the first terminal section 201 is installed in the bus bar 20, i.e., becomes a second terminal section 202.

(Bobbin)

Figure 6:
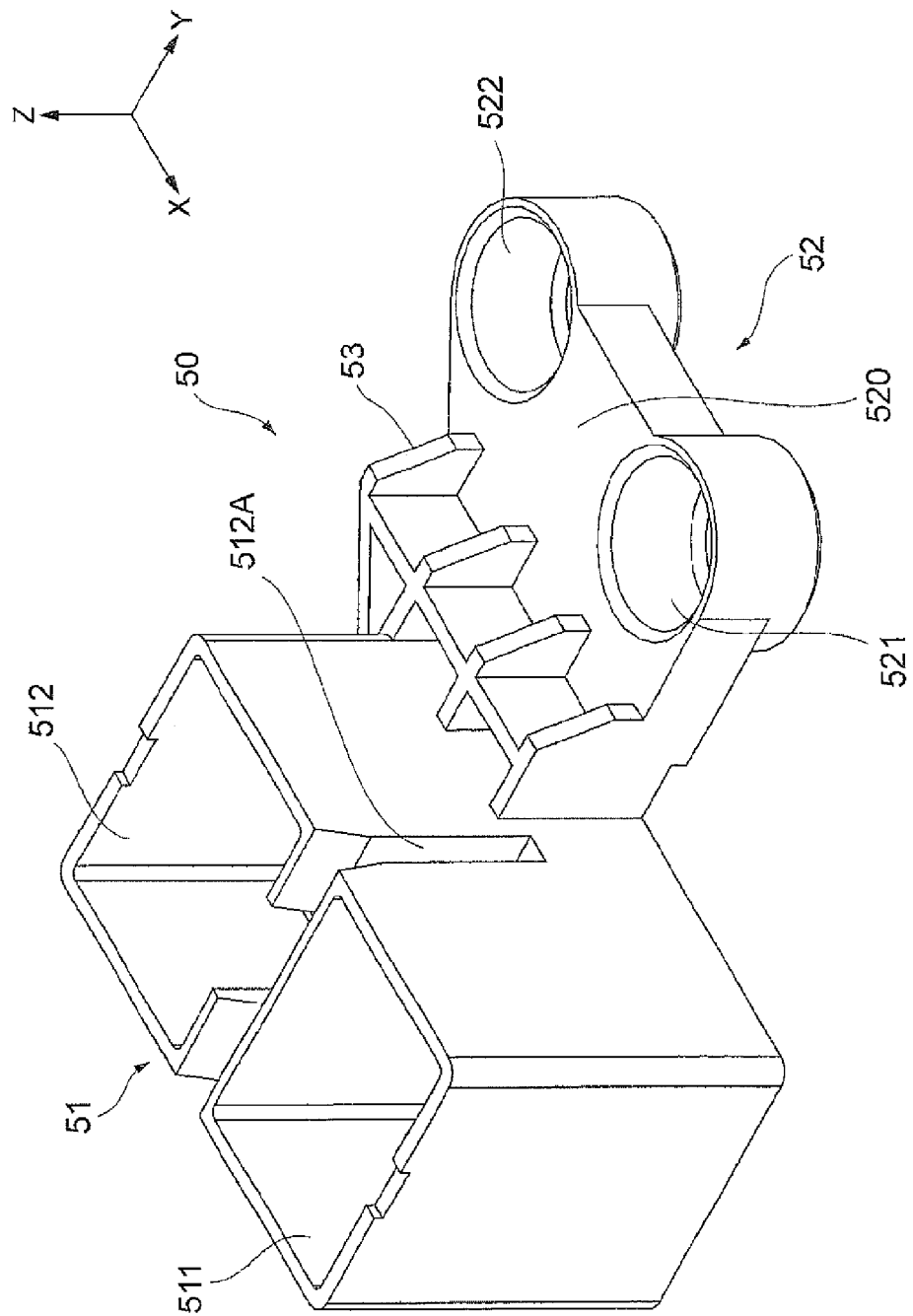
FIG. 6 is a perspective view of a bobbin.
Figure 7:
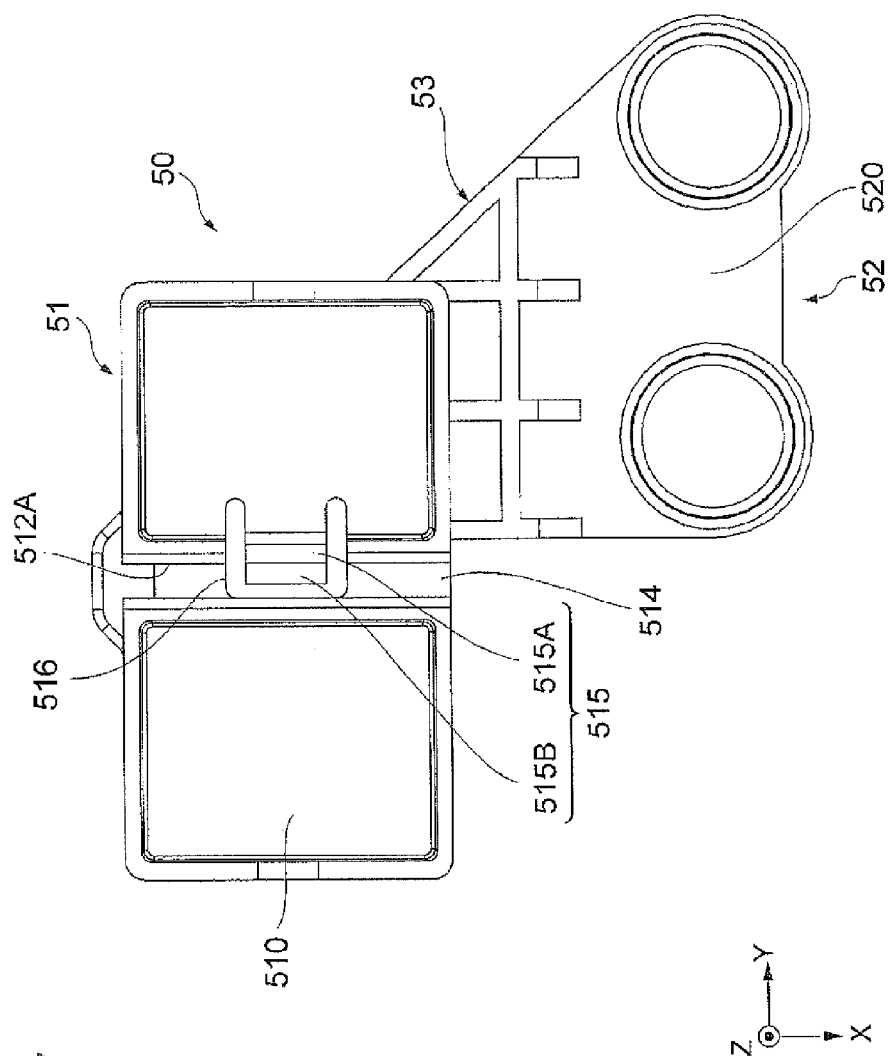
FIG. 7 is a top view of the bobbin.
Figure 8:
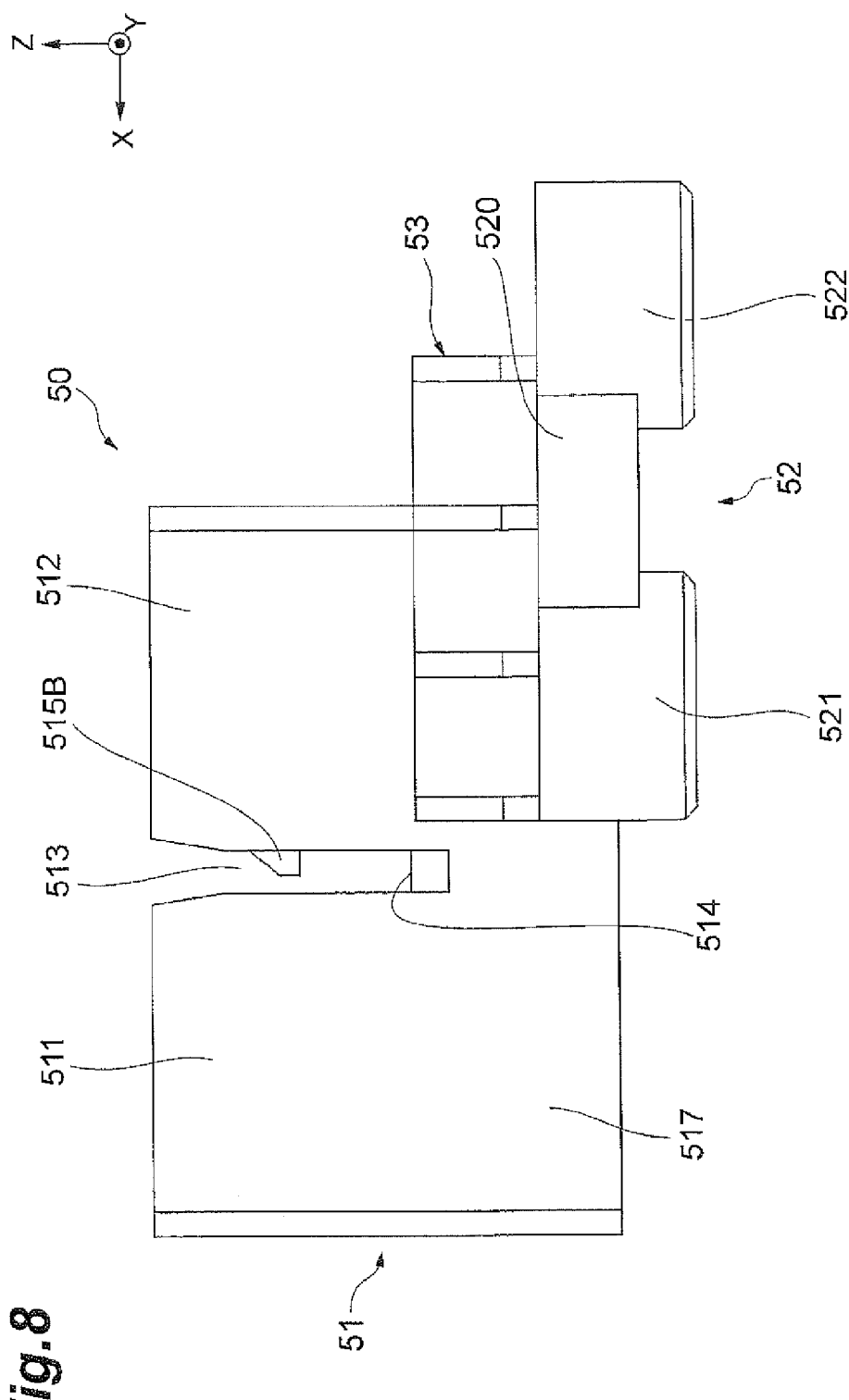
FIG. 8 is a side view of the bobbin in a +Y direction.
Figure 9:
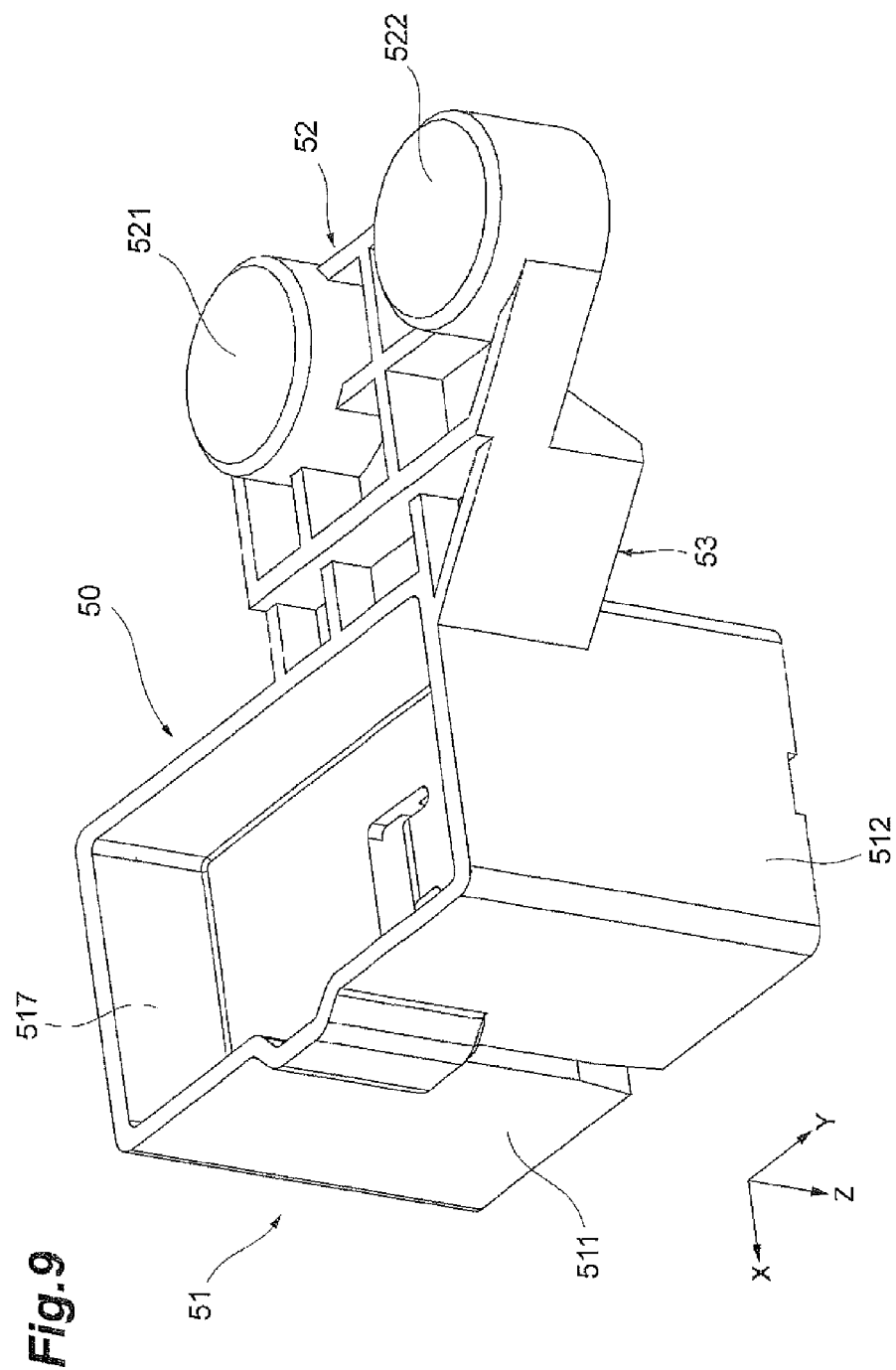
FIG. 9 is a perspective view of the bobbin from a lower surface side.

Next, the bobbin 50 will be described with reference to FIGS. 6 to 9. FIG. 6 is a perspective view of the bobbin 50, and FIG. 7 is a top view of the bobbin 50. In addition, FIG. 8 is a side view of the bobbin 50 when seen in the +Y direction, and FIG. 9 is a perspective view of the bobbin 50 when seen from a lower surface side. The bobbin 50 is integrally formed of a material having an insulation property such as a resin or the like, and attached to a region of the electronic component 100 at which the noise filter 40 is formed and a region to which the output condenser 70 is connected.

The bobbin 50 is configured to include a core accommodating section 51 configured to accommodate the magnetic body cores 61 and 62 that constitute the noise filter 40, and a pocket section 52 having a concave-shaped recess formed to correspond to the through-hole of the bus bar 20. The core accommodating section 51 and the pocket section 52 are connected by a connecting section 53.

The core accommodating section 51 is formed to extend in a Z-axis direction with an appearance of a rectangular cross-sectional shape on a main surface of one side (a +Z side) of a partition section 510 having a flat plate shape, and two separate core leg section accommodating sections 511 and 512 (first core accommodating section) are spaced apart from each other to individually accommodate leg sections of the magnetic body core. Shapes of sidewalls of the core leg section accommodating sections 511 and 512 correspond to shapes of the inserted leg sections of the magnetic body core 61 (the first magnetic body core). In addition, a distance between the core leg section accommodating sections 511 and 512 also corresponds to a distance between the two leg sections of the magnetic body core 61. In addition, an end surface of a −Z side of the core leg section accommodating sections 511 and 512 is closed by the partition section 510. The leg sections of the magnetic body core inserted into the core leg section accommodating sections 511 and 512 in the +Z direction are configured to abut the bottom surfaces of the core leg section accommodating sections 511 and 512 to restrict movement in the Z-axis direction of the magnetic body core.

An aperture section 513 configured to dispose the bus bar 20 is formed between the core leg section accommodating sections 511 and 512, and a bottom surface 514 is formed at a position higher than the bottom surfaces of the core leg section accommodating sections 511 and 512. This is because, when the bus bar 20 is put into the bobbin 50, the bus bar 20 is prevented from being reversed 180 degrees in the Z-axis direction and attached. Further, when the bus bar 20 is disposed, heights of the core leg section accommodating sections 511 and 512 are adjusted such that an upper surface of the bus bar 20 is disposed at a lower position in a height direction than the upper end sections of the core leg section accommodating sections 511 and 512. In addition, in the vicinity of a center of a wall surface 512A of the aperture section 513 side of the core leg section accommodating section 512, a locking section 515 having an elastic section 515A extending along the wall surface 512A in the Z-axis direction and a claw section 515B formed to continue to the elastic section 515A and protruding more outward than the wall surface 512A (the core leg section accommodating section 511 side) are included. An opening 516 is formed around a periphery of the locking section 515 (see FIG. 7). In the claw section 515B of the locking section 515, an upper surface side has an inclined surface, the elastic section 515A is bent to enable slight movement in the X-axis direction, and the bobbin 50 can be locked to the bus bar 20 as the claw section 515B is caught on the bus bar 20. This will be described below.

The second core accommodating section 517 (the second magnetic body core accommodating section) configured to accommodate the magnetic body core 62 (the second magnetic body core) is formed on the main surface (the lower surface side) of the partition section 510 opposite to the core leg section accommodating sections 511 and 512. A shape of the sidewall of the second core accommodating section 517 corresponds to an appearance of the inserted magnetic body core 62. That is, the magnetic body cores 61 and 62 can be attached to the bobbin 50 to sandwich the partition section 510 of the core accommodating section 51 therebetween.

Next, the pocket section 52 will be described. The pocket section 52 is installed to continue to the connecting section 53 formed at a side surface of the core accommodating section 51 of the core leg section accommodating section 512 side, and configured to include a flat plate section 520 extending along the XY plane and having a flat plate shape, and concave sections 521 and 522 protruding downward from the flat plate section 520. The flat plate section 520 is flush with a surface shape of the lower surface side of the bus bar 20 because a surface of the flat plate section 520 is opposite to a lower surface side of the link section 25 of the bus bar 20.

The concave sections 521 and 522 are installed at positions corresponding to the screw holes 251 and 252 of the bus bar 20, respectively, as the bus bar 20 and the bobbin 50 are assembled. The concave sections 521 and 522 have an inner diameter larger than that of the screw holes 251 and 252.

The connecting section 53 configured to connect the core accommodating section 51 and the pocket section 52 is installed at a position at which it does not interfere with the bus bar 20 and the other components when they are assembled to the bobbin 50. Further, while the connecting section 53 (both surfaces) and the flat plate section 520 (the lower surface side) have ribs formed to reinforce themselves, structures for reinforcement may be appropriately modified.

(Conductive Component)

Figure 10:
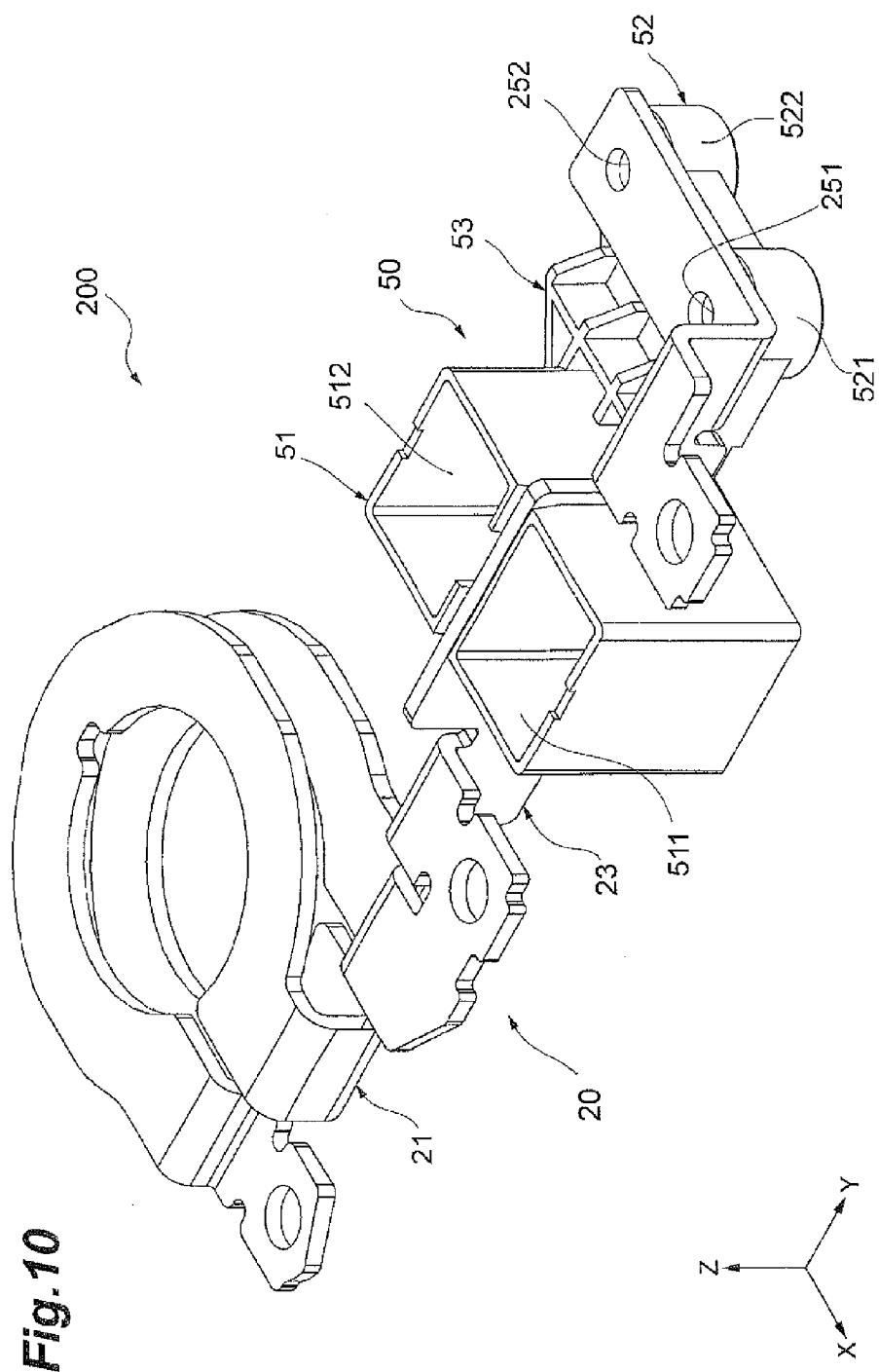
FIG. 10 is a perspective view of the conductive component.
Figure 11:
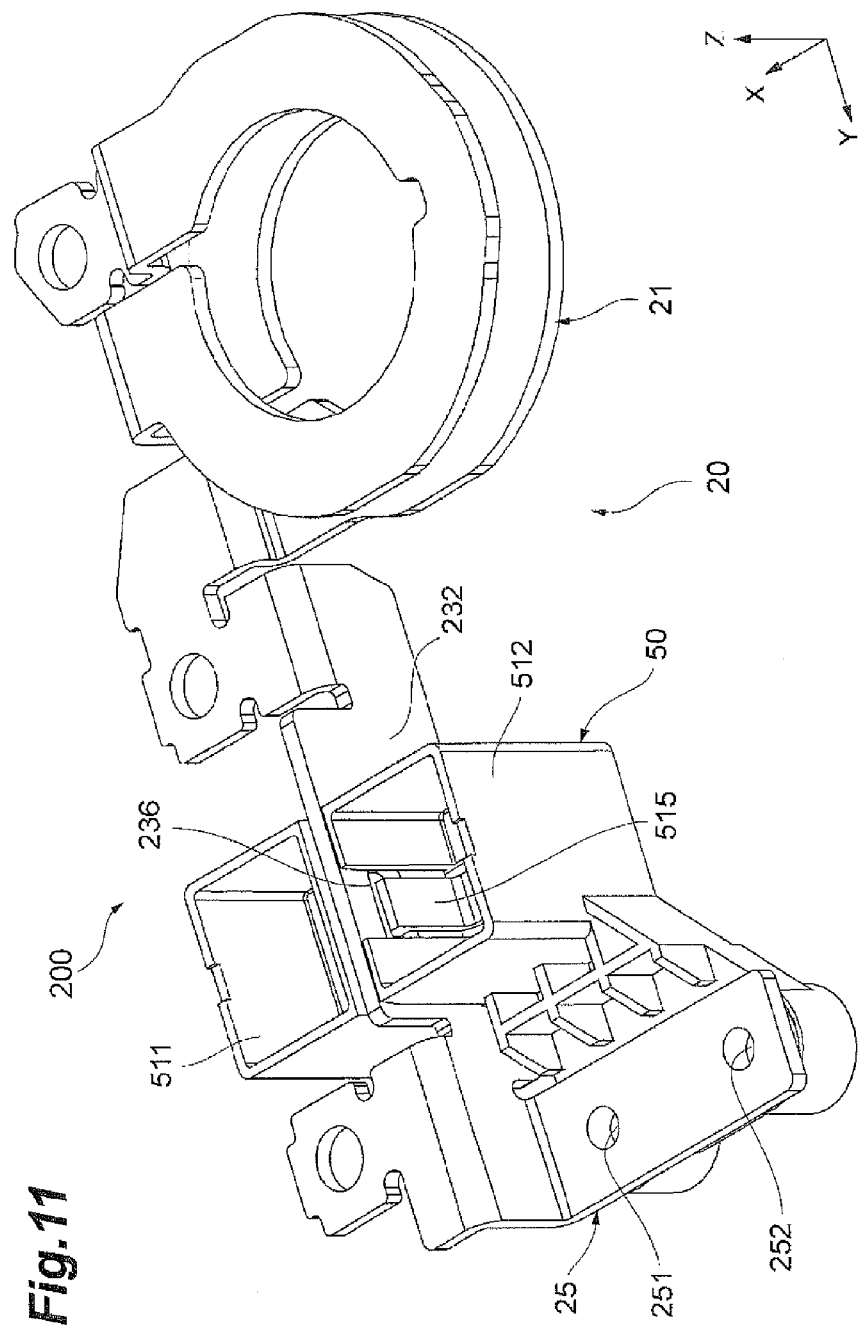
FIG. 11 is a perspective view of the conductive component from the lower surface side.
Figure 12:
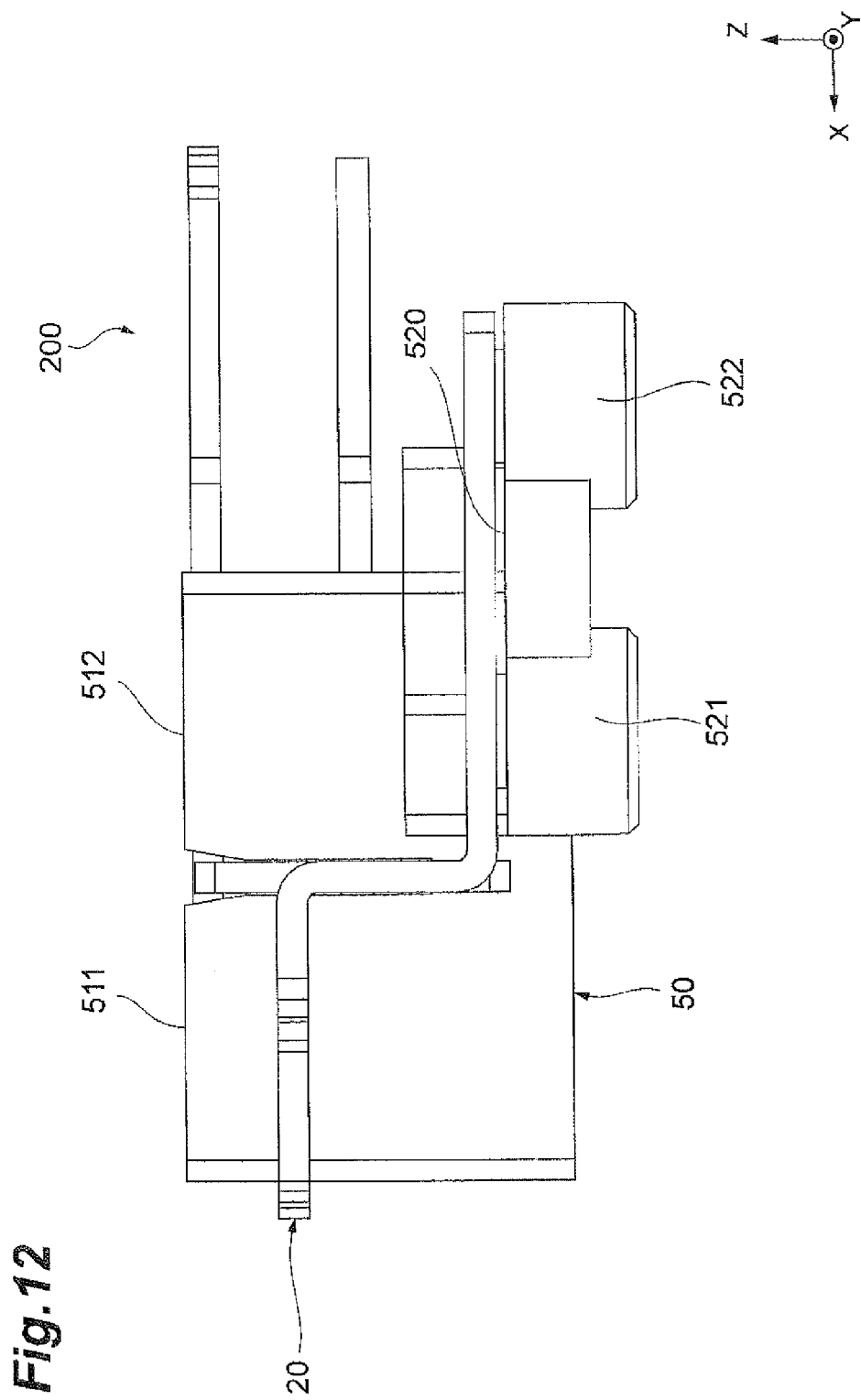
FIG. 12 is a side view of the conductive component in the +Y direction.

Next, a conductive component 200 obtained by assembling the bus bar 20 and the bobbin 50 will be described with reference to FIGS. 10 to 12. FIG. 10 is a perspective view of the conductive component 200, and FIG. 11 is a perspective view of the conductive component 200 when seen from the lower surface side. In addition, FIG. 12 is a side view of the conductive component 200 in the +Y direction.

Further, when the electronic component 100 is assembled, the bobbin 50 is attached to the bus bar 20 before the output condenser 70 and the penetration type terminal stand 80 are attached. Accordingly, a metal powder generated when the output condenser 70 and the penetration type terminal stand 80 are attached is suppressed from being scattered therearound. This will be described below.

As shown in FIGS. 10 and 11, the bobbin 50 is attached to the filter section 23 of the bus bar 20. Specifically, the bus bar 20 is inserted between the core leg section accommodating sections 511 and 512 such that the second conductive section 232 of the bus bar 20 moves the bobbin 50 to enter the aperture section 513 of the bobbin 50 from a lower side (a −Z side) of the bus bar 20. Here, in the locking section 515 of the bobbin 50, when the bus bar 20 abuts an inclined section of the upper surface side of the claw section 515B, the elastic section 515A is bent according to movement of the bus bar 20 along the inclination, and when the claw section 515B is disposed at a higher position than the lower surface of the through-hole 236 of the bus bar 20, the elastic section 515A returns to its original state, a portion of the claw section 515B is caught in the through-hole 236, and the bus bar 20 and the bobbin 50 are locked to each other (see FIGS. 11 and 14). Accordingly, the conductive component 200 in which the bobbin 50 is locked to the bus bar 20 is obtained.

Here, in the conductive component 200, the lower surface side of the link section 25 of the bus bar 20 is opposite to the upper surface side of the pocket section 52 of the bobbin 50 (see FIG. 12), and the lower surface sides of the screw holes 251 and 252 formed in the link section 25 are surrounded by the concave sections 521 and 522 of the bobbin 50. "Surrounded" means that the bottom surfaces of the concave sections 521 and 522 are formed at positions spaced apart from the end surfaces of the screw holes 251 and 252, and an aperture is formed between the end surfaces of the screw holes 251 and 252 and the bottom surface of the concave section. Further, the concave sections 521 and 522 may completely close the end sections of the one sides of the screw holes 251 and 252, and a gap may be formed between the bus bar 20 and the concave sections 521 and 522. When the end sections of the one sides of the screw holes 251 and 252 are surrounded by the concave sections 521 and 522 of the bobbin 50, a screw used for screw-fastening is inserted from an end section opposite to the side surrounded by the concave sections 521 and 522 and fixed. Accordingly, a metal powder or the like that may be generated from the bus bar 20 when another component is screw-fastened and fixed using the screw holes 251 and 252 can be received in the concave sections 521 and 522.

(Attachment of Magnetic Body Core)

Figure 13:
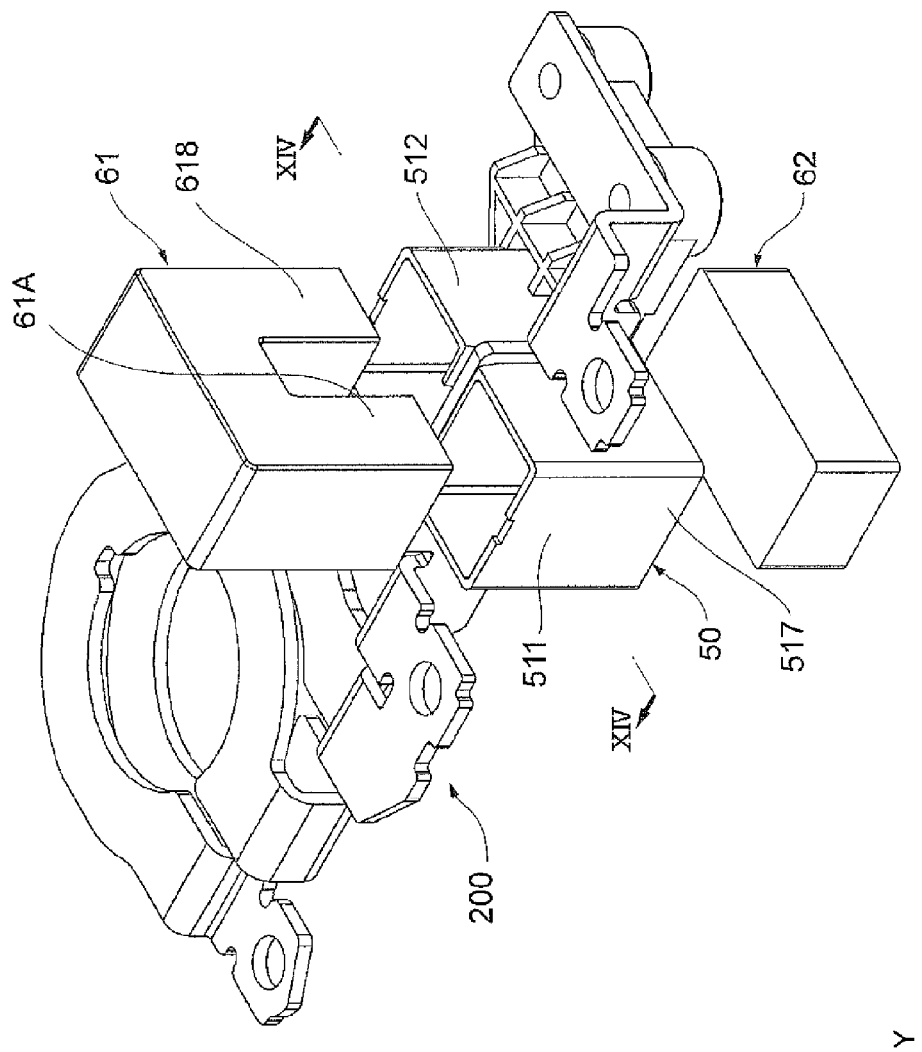
FIG. 13 is an exploded perspective view of a magnetic body core and the conductive component.

Next, a process of attaching the magnetic body cores 61 and 62 to the conductive component 200 will be described with reference to FIGS. 13 and 14. FIG. 13 is an exploded perspective view of the magnetic body cores 61 and 62 and the conductive component 200, and FIG. 14 is a view for describing a cross-section of the conductive component 200 to which the magnetic body cores 61 and 62 are attached, corresponding to line XIV-XIV of FIG. 13.

Figure 14:
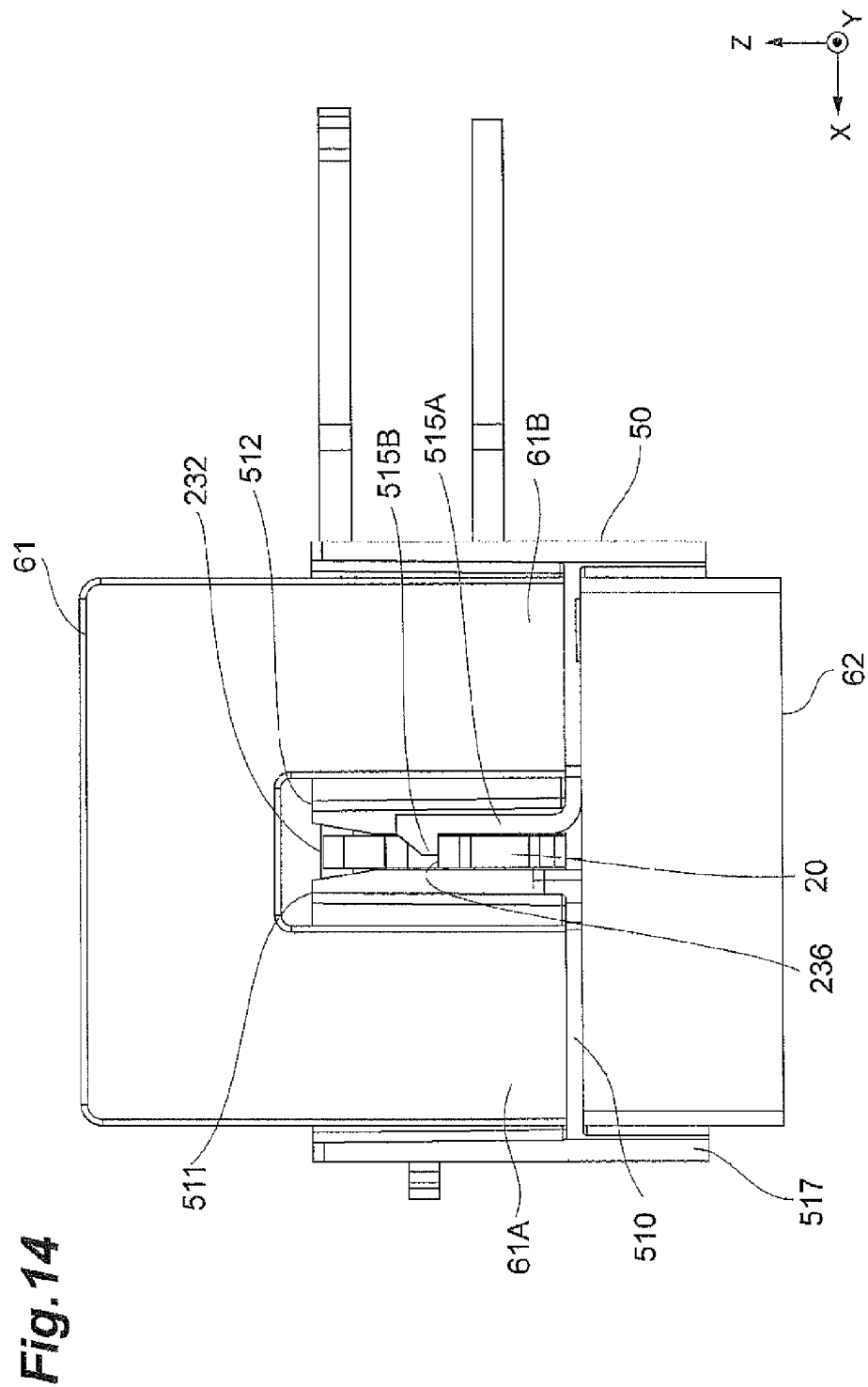
FIG. 14 is a view for describing a cross section of the conductive component to which the magnetic body core is attached, corresponding to line XIV-XIV of FIG. 13.

As shown in FIGS. 13 and 14, the magnetic body core 61 attached to an upper side of the bus bar 20 is a so-called U type core, and includes two leg sections 61A and 61B. As the leg section 61A, which is one of these, is inserted into the core leg section accommodating section 511 and the other leg section 61B is inserted into the core leg section accommodating section 512, the magnetic body core 61 is attached to the bobbin 50. Meanwhile, the magnetic body core 62, which is an I type core, is inserted into the second core accommodating section 517 from a lower side of the bus bar 20. Here, as shown in FIG. 14, the magnetic body core 61 and the magnetic body core 62 are opposite to each other via the partition section 510 of the bobbin 50, and an annular core having substantially a mouth shape when seen in an XZ plane is formed by the magnetic body cores 61 and 62. Further, a central section thereof is disposed such that the bus bar 20 extends in the Y-axis direction.

Here, the bus bar 20 is prevented from being short-circuited because left, right and lower sides of the periphery thereof are divided into the magnetic body cores 61 and 62 by the bobbin 50. Further, in the upper side of the bus bar 20, since the bobbin 50 is locked to the bus bar 20 such that upper ends of the core leg section accommodating sections 511 and 512 are higher than an upper end of the second conductive section 232, the bus bar 20 is prevented from abutting the magnetic body core 61. In this way, the bobbin 50 prevents the magnetic body core 61 from abutting the magnetic body core 62 while maintaining an insulation property between the magnetic body cores 61 and 62 and the bus bar 20, As described above, the magnetic body cores 61 and 62 are attached to the bobbin 50 of the conductive component 200 to form the noise filter 40.

(Attachment of Output Condenser and Penetration Type Terminal Stand)

Figure 15:
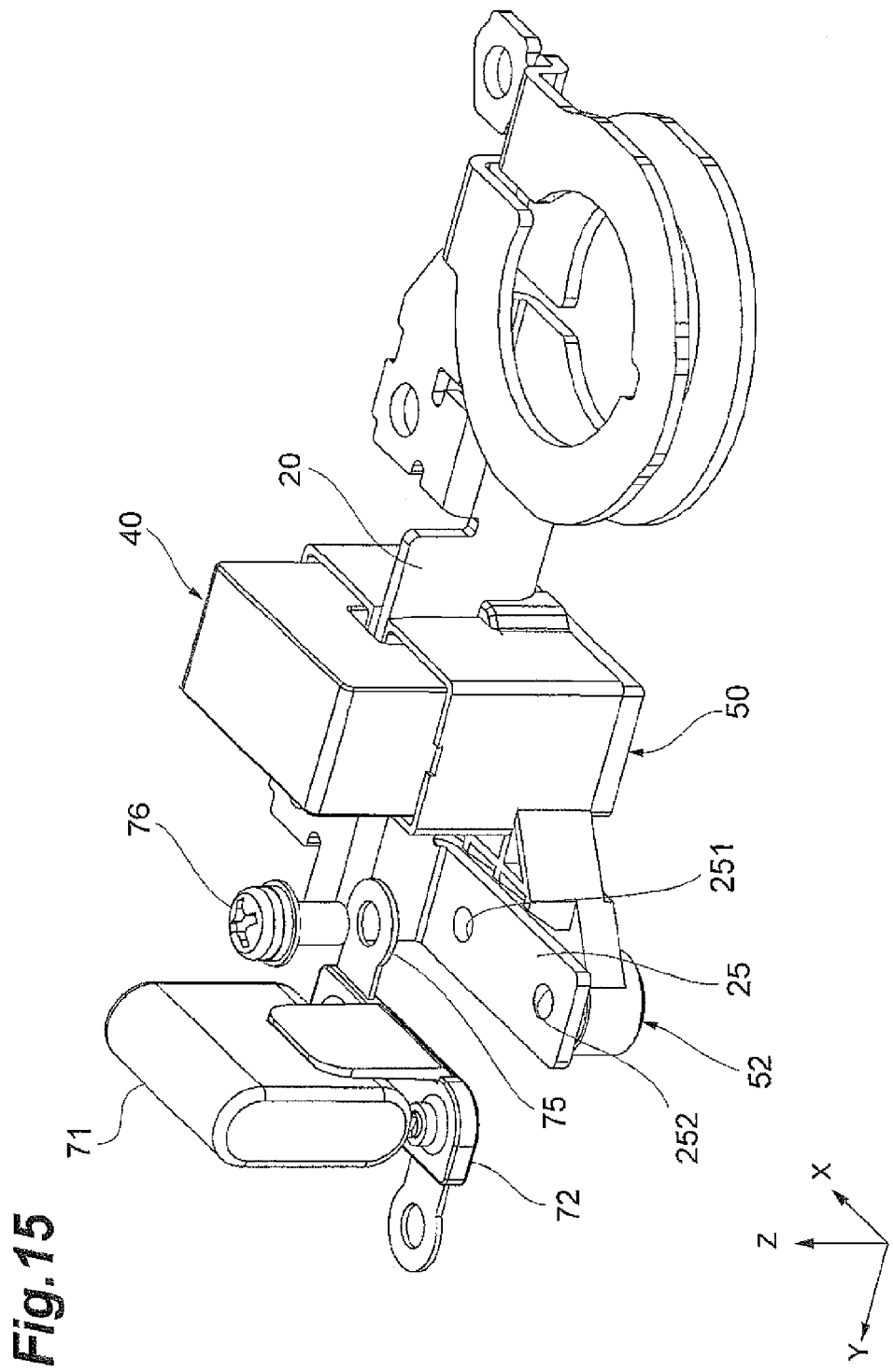
FIG. 15 is a view for describing an attachment method of an output condenser.

Next, a method of attaching an output condenser will be described with reference to FIG. 15. The output condenser 70 is configured to include a condenser main body 71, a terminal section 72 connected to the condenser main body 71, and a screw 76 configured to fix the terminal section 72 to the bus bar 20. In the two terminal sections 72 connected to the condenser main body 71, as the screw 76 is inserted through a through-hole 75 of the one terminal section and the screw hole 251 formed in the link section 25 of the bus bar 20 to fasten and fix them, the output condenser 70 is fixed to the bus bar 20.

Here, when the screw 76 is inserted through the through-hole 75 of the terminal section 72 and the screw hole 251 of the bus bar 20, portions of inner walls of the through-hole 75 and the screw hole 251 may be cut by the screw 76, and thus probability of generation of a metal powder is considered. When the metal powder drops downward, occurrence of a short circuit or the like due to attachment to another electronic component or the like is also considered. In this regard, as the concave section 521 formed at the pocket section 52 of the bobbin 50 is formed at a lower side of the screw hole 251 to cover the screw hole 251 of the bus bar 20, even when the metal powder is generated by the screw 76, since metal powder drops in the concave section 521, the metal powder can be prevented from sticking to the other electronic component or the like.

Figure 16:
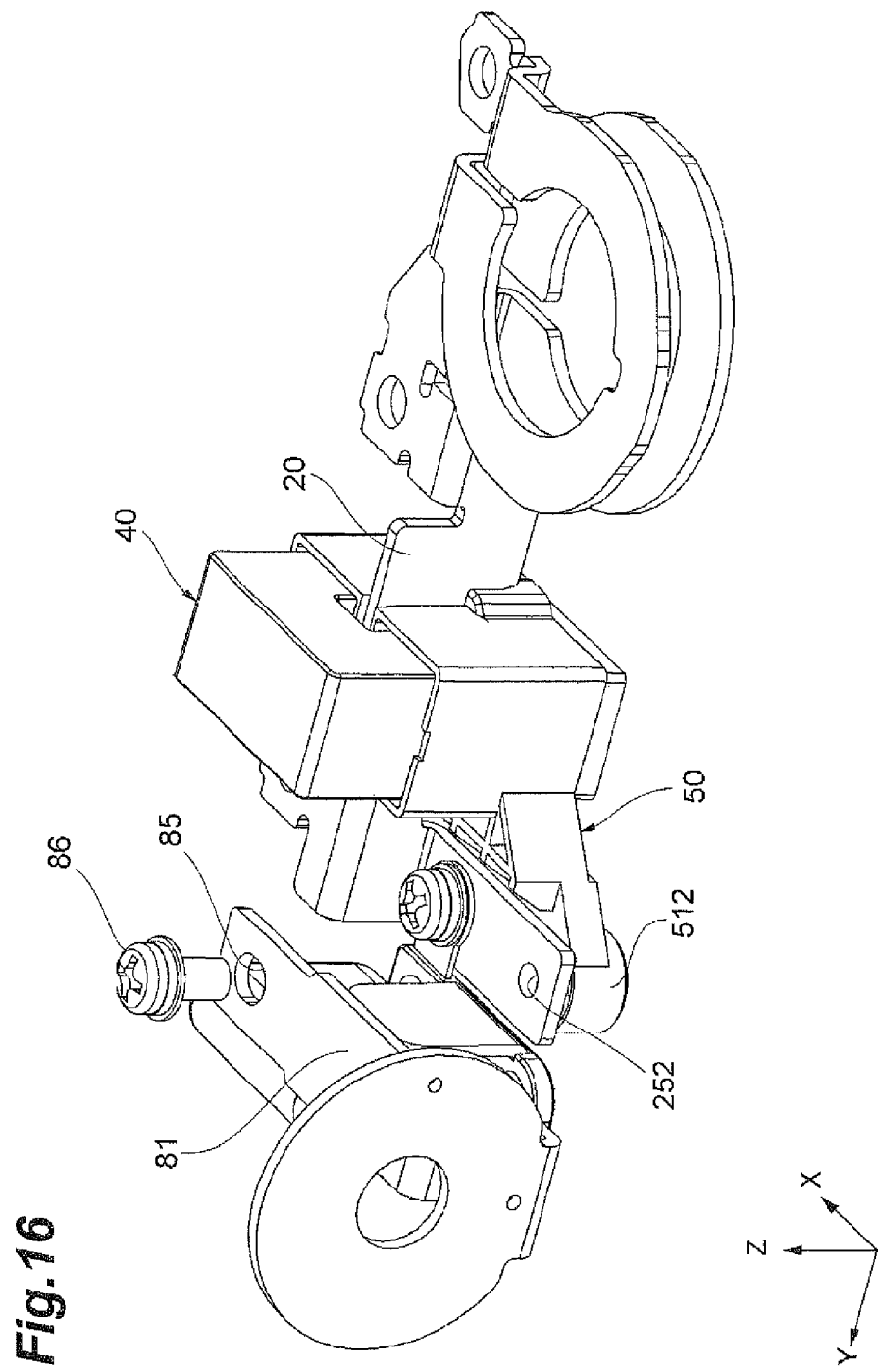
FIG. 16 is a view for describing an attachment method of a penetration type terminal stand.

Next, a method of attaching the penetration type terminal stand will be described with reference to FIG. 16. In FIG. 16, in the penetration type terminal stand 80, only a conductive member 81 electrically connected to the bus bar 20 is shown, and illustration of an insulating member or the like of a periphery thereof is omitted. In the conductive member 81, as a through-hole 85 is formed in an end section connected to the bus bar 20 and a screw 86 is inserted through the through-hole 85 and the screw hole 252 formed in the link section 25 of the bus bar 20 to fasten and fix them, the penetration type terminal stand 80 is fixed to the bus bar 20.

Here, when the screw 86 is inserted through the through-hole 85 of the conductive member 81 and the screw hole 252 of the bus bar 20, portions of inner walls of the through-hole 85 and the screw hole 252 may be cut by the screw 86, and thus probability of generation of the metal powder is considered. In this regard, as the screw hole 252 is formed downward such that the concave section 522 formed in the pocket section 52 of the bobbin 50 covers the screw hole 252 of the bus bar 20, even when the metal powder is generated by the screw 86, since the metal powder drops in the concave section 522, like the concave section 521, the metal powder can be prevented from sticking to the other electronic component or the like.

(Formation of Choke Coil)

Figure 17:
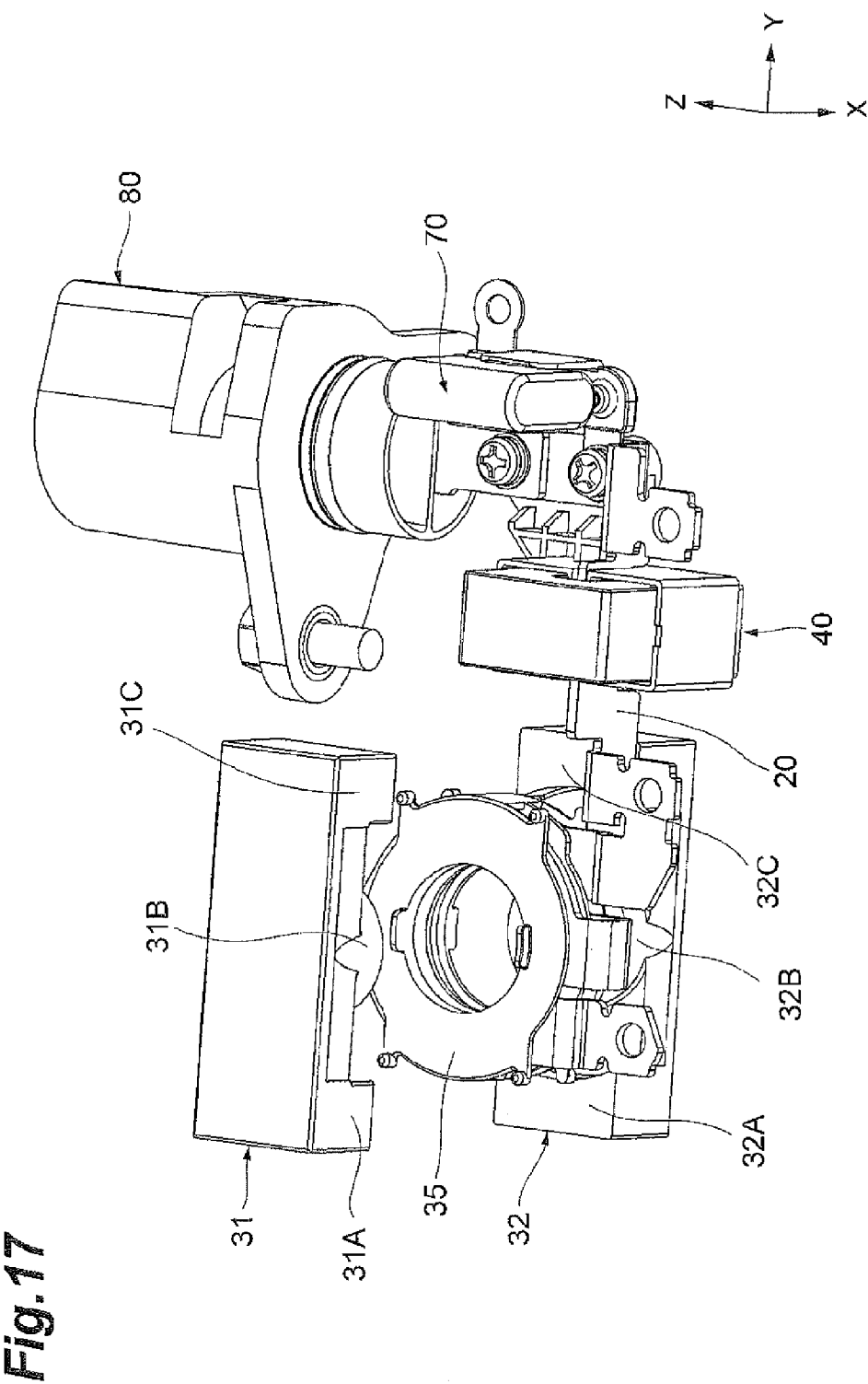
FIG. 17 is a view for describing a method of making a choke coil.

Finally, a method of forming the choke coil 30 using the coil section 21 of the bus bar 20 that constitutes the conductive component 200 will be described with reference to FIG. 17. First, the bobbin 35 for coils formed of a resin is attached to the coil section 21 of the bus bar 20. Then, E type magnetic body cores 31 and 32 are opposite to each other with the coil section 21 sandwiched therebetween, and attached to the coil section 21 such that the leg sections are opposite to each other. That is, leg sections 31A, 31B and 31C of the magnetic body core 31 are attached to be opposite to leg sections 32A, 32B and 32C of the magnetic body core 32, respectively. Here, the leg sections 31B and 32B are inserted into the openings 221 and 222 of the coil section 21. As a result, the magnetic body cores 31 and 32 are attached to the coil section 21 via the bobbin 35 for coils to complete the choke coil 30. In addition, the electronic component 100 is configured through the above-mentioned processes.

As described above, according to the bobbin 50 (the insulating component) that constitutes the electronic component 100 (the conductive component 200) according to the embodiment, the two leg sections 61A and 61B of the magnetic body core 61 are inserted into the core leg section accommodating sections 511 and 512 of the first magnetic body core accommodating section, and the magnetic body core 62 is accommodated in the second core accommodating section 517. Further, since the bus bar 20 is inserted into the aperture section 513 formed between the two core leg section accommodating sections 511 and 512, a high insulation property between the bus bar 20 and the pair of magnetic body cores 61 and 62 is maintained by the bobbin 50. Further, since the bobbin 50 can be locked to the bus bar 20 by the locking section 515 and the bobbin 50 can be locked to and integrated with the bus bar 20, good workability can be obtained.

In addition, in the conductive component 200 of the embodiment including the bus bar 20 and the bobbin 50, as the bobbin 50 includes the claw section 515B locked to the through-hole 236 formed in the second conductive section 232 of the bus bar 20 and the elastic section 515A that continues to the claw section 515B is bent when the bus bar 20 is inserted, the claw section 515B is locked to the through-hole 236. Accordingly, the bus bar 20 and the bobbin 50 can be easily integrated, the claw section 515B is not easily removed from the through-hole 236, and improvement of workability can be realized more simply.

Further, in the conductive component 200, since the end sections of the upper sides of the two core leg section accommodating sections 511 and 512 protrude from the end section of the second conductive section 232 of the bus bar 20 (protrude upward), for example, since the contact with the bus bar 20 can be prevented even when the electronic components such as the pair of magnetic body cores 61 and 62 are placed at the end section sides of the two core leg section accommodating sections 511 and 512, a high insulation property can be obtained. In particular, in the conductive component 200 of the embodiment, contact between the magnetic body core 61 and the bus bar 20 on the two core leg section accommodating sections 511 and 512 can be prevented.

Further, as the bus bar 20 has the screw holes 251 and 252 serving as through-holes configured to screw-fasten and fix the output condenser 70 and the penetration type terminal stand 80, which are different members from the bobbin 50, and the bobbin 50 has the concave sections 521 and 522 configured to surround the one end sections of the screw holes 251 and 252, respectively, the metal powder generated as the screws 76 and 86 cut the bus bar 20 and the other members upon screw fastening can be suppressed from being scattered therearound. Accordingly, the bus bar 20 and the other electronic component can be prevented from being short-circuited by the metal powder while preventing the metal powder from sticking to the electronic component of the surroundings.

As described above, while the embodiment of the present invention has been described, the present invention is not limited to the above-mentioned conductive component of the present invention but various modifications may be performed. For example, in the embodiment, while the configuration in which the pocket section 52 of the bobbin 50 is attached to the core leg section accommodating section 512 side of the core accommodating section 51 has been described, a positional relation between the core accommodating section 51 and the pocket section 52 can be appropriately varied according to the shape of the bus bar 20. In addition, the shape of the connecting section 53 can be appropriately varied according to a distance and a positional relation between the core accommodating section 51 and the pocket section 52, and disposition of the bus bar 20 and the electronic component or the like therearound.

In addition, in the above-mentioned conductive component 200, while the bus bar is inserted into the aperture section 513 in a state in which the main surface of the second conductive section 232 of the bus bar 20 inserted between the two core leg section accommodating sections 511 and 512 extends along the YZ plane, i.e., extends in the vertical direction, the bus bar may be inserted into the aperture section 513 while extending in the horizontal direction. In this case, the shapes of the magnetic body cores 61 and 62, the shape of the bobbin 50 (in particular, the shapes of the core leg section accommodating sections 511 and 512 and the shape of and the locking section 515), and so on, can be appropriately varied.

In addition, while the above-mentioned bobbin 50 is configured to include the core accommodating section 51 configured to accommodate the magnetic body cores 61 and 62 to maintain insulation from the bus bar 20 and the pocket section 52 in which the concave section is formed to correspond to the screw hole of the bus bar 20, the bobbin 50 may have only one of these functions. That is, a configuration of only the core accommodating section 51 having a locking section configured to be locked to the bus bar 20 is also included in the insulating component according to the present invention. In addition, the conductive component according to the present invention also includes a conductive component including an insulating component having a concave section configured to surround the one end section of the screw hole formed in the bus bar 20 and a locking section configured to be locked to the bus bar 20, and the bus bar 20. In this way, as the conductive component has the insulating component having the concave section surrounding the one end section of the screw hole configured to be screw-fastened and fixed to the bus bar 20, since the metal powder generated from the bus bar or the like when screw-fastened and fixed can be suppressed from being scattered, these can be assembled in a state in which the high insulation property between the bus bar and the other component is maintained.

In the bobbin 50 that constitutes the conductive component 200 according to the embodiment, while the locking section 515 is formed at the core accommodating section 51, when the insulating component does not include the core accommodating section 51, the position of the locking section can be varied.

Further, the shape of the locking section 515 of the bobbin 50 is not limited to a configuration of hooking the claw section 515B to the through-hole 236 formed in the bus bar 20 but may be appropriately varied. In addition, while the case in which an inclined surface is formed at the upper surface side has been described, the claw section 515B can be appropriately varied within a range of a protrusion shape having R or the like in which the present invention can be performed.

In addition, while the case in which the magnetic body core 61 according to the embodiment is a so-called U type core including the two leg sections 61A and 62B, the leg section 61A is inserted into the core leg section accommodating section 511, and the other leg section 61B is inserted into the core leg section accommodating section 512 has been described, the present invention can be applied to the case in which, for example, the magnetic body core is a magnetic body core having three or more leg sections of an E type. Even when there are three or more leg sections, the magnetic body may have core leg section accommodating sections configured to accommodate at least two leg sections, and the core leg section accommodating sections may be disposed to be spaced apart from each other.

What is claimed is:

1. An insulating component constituted by a member having an insulation property, comprising:
    a first core accommodating section having two parallel core leg section accommodating sections that each individually surrounds one of at least two leg sections of a first magnetic body core of a pair of magnetic body cores which are spaced apart from each other;
    a second core accommodating section that surrounds a second magnetic body core of the pair of magnetic cores;
    a locking section locked to a bus bar inserted into an aperture section located between the two parallel core leg section accommodating sections; and
    wherein each of the two parallel core leg section accommodating sections has a top edge, a bottom surface and a side wall;
    the top edges of the two parallel core leg section accommodating sections are in the same plane;
    the two bottom surfaces of the two parallel core leg section accommodating sections are in the same plane, and
    each of the side walls encompasses one of the at least two leg sections.

2. A conductive component comprising:
    the insulating component according to claim 1; and
    a conductive bus bar inserted into the aperture section, wherein a through-hole is formed in the bus bar, and
    the locking section of the insulating component includes a claw section locked to the through-hole.

3. The conductive component according to claim 2, wherein end sections of the two core leg section accommodating sections protrude more than an end section of the bus bar disposed between the two core leg section accommodating sections.

4. The conductive component according to claim 2, wherein the bus bar has a screw hole serving as a through-hole which screw-fastens and fixes a member different from the insulating component, and
    the insulating component has a concave section which surrounds one end section of the screw hole.

5. The conductive component according to claim 3, wherein the bus bar has a screw hole serving as a through-hole which screw-fastens and fixes a member different from the insulating component, and
    the insulating component has a concave section which surrounds one end section of the screw hole.

6. A conductive component comprising:
    an insulating component constituted by a member having an insulation property; and
    a conductive bus bar having a screw hole serving as a through-hole which screw-fastens and fixes a member different from the insulating component,
    wherein the insulating component has a concave section which surrounds one end section of the screw hole;
    a first core accommodating section having two parallel core leg section accommodating sections that each individually surrounds one of at least two leg sections of a first magnetic body core of a pair of magnetic body cores which are spaced apart from each other;
    a second core accommodating section that surrounds a second magnetic body core of the pair of magnetic cores;
    a locking section locked to a bus bar inserted into an aperture section located between the two parallel core leg section accommodating sections; and
    wherein each of the two parallel core leg section accommodating sections has a top edge, a bottom surface and a side wall;
    the top edges of the two parallel core leg section accommodating sections are in the same plane;
    the two bottom surfaces of the two parallel core leg section accommodating sections are in the same plane, and each of the side walls encompasses one of the at least two leg sections.

7. An insulating compound according to claim 1, further comprising a partition between the first core accommodating section and the second core accommodating section.

8. An insulating component according to claim 1, wherein each of the two parallel core leg section accommodating sections has a substantially rectangular cross section.

9. An insulating component according to claim 1, wherein the aperture section has an opening between the top edges of the two parallel core leg section accommodating sections and extends between the side walls of the two parallel core leg section accommodating sections.

10. An insulating component according to claim 7, wherein the locking section extends into the aperture section to engage a leg bar.

11. An insulting component according to claim 10, wherein the locking section extends elastically into the aperture section.

* * * * *